US009002692B2

(12) United States Patent
Dong et al.

(10) Patent No.: US 9,002,692 B2
(45) Date of Patent: Apr. 7, 2015

(54) ELECTRONIC CIRCUIT SIMULATION METHOD WITH ADAPTIVE ITERATION

(75) Inventors: He Dong, Winchester, MA (US); Michael Z. Chui, Los Altos Hills, CA (US); Shan Yuan, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 615 days.

(21) Appl. No.: 13/419,289

(22) Filed: Mar. 13, 2012

(65) Prior Publication Data
US 2013/0246015 A1 Sep. 19, 2013

(51) Int. Cl.
G06F 17/50 (2006.01)
G06F 17/10 (2006.01)
G06F 17/11 (2006.01)

(52) U.S. Cl.
CPC ............ *G06F 17/5036* (2013.01); *G06F 17/11* (2013.01)

(58) Field of Classification Search
CPC .................................................. G06F 17/5036
USPC ........................................................... 703/14
See application file for complete search history.

(56) References Cited

U.S. PATENT DOCUMENTS

| | | | |
|---|---|---|---|
| 4,918,643 A * | 4/1990 | Wong ................................ 703/4 |
| 5,379,231 A * | 1/1995 | Pillage et al. .................... 703/14 |
| 5,588,142 A * | 12/1996 | Sharrit ............................. 703/14 |
| 5,666,367 A * | 9/1997 | Troyanovsky ................. 714/724 |
| 5,808,915 A * | 9/1998 | Troyanovsky .................. 703/14 |
| 5,963,724 A * | 10/1999 | Mantooth et al. ............... 703/14 |
| 6,154,716 A * | 11/2000 | Lee .................................... 703/2 |
| 6,236,956 B1 * | 5/2001 | Mantooth et al. ............... 703/14 |
| 6,314,390 B1 * | 11/2001 | Bittner et al. .................... 703/14 |
| 6,577,992 B1 | 6/2003 | Deng et al. |
| 7,085,700 B2 * | 8/2006 | O'Riordan et al. ............. 703/14 |
| 7,409,328 B1 * | 8/2008 | McGaughy et al. ............. 703/14 |
| 7,444,604 B2 * | 10/2008 | Croix et al. .................... 716/136 |
| 7,464,349 B1 * | 12/2008 | Keller et al. .................. 716/136 |
| 7,484,195 B1 * | 1/2009 | Korobkov ..................... 716/113 |
| 7,505,882 B2 * | 3/2009 | Jenny et al. ....................... 703/2 |
| 7,555,416 B2 * | 6/2009 | Cheng et al. .................... 703/14 |
| 7,970,591 B1 * | 6/2011 | Ratzlaff ............................ 703/2 |
| 8,670,969 B1 * | 3/2014 | Kundert .......................... 703/14 |
| 2003/0018459 A1 * | 1/2003 | O'Riordan et al. ............. 703/14 |
| 2003/0046045 A1 * | 3/2003 | Pileggi et al. ..................... 703/4 |
| 2003/0144824 A1 * | 7/2003 | Yang et al. ...................... 703/14 |
| 2004/0044510 A1 * | 3/2004 | Zolotov et al. ................. 703/14 |
| 2005/0177807 A1 * | 8/2005 | Ma et al. ........................... 716/5 |
| 2005/0273298 A1 * | 12/2005 | Shah ................................. 703/2 |

(Continued)

OTHER PUBLICATIONS

Honkala, Mikko; et al. "New Multilevel Newton-Raphson Method for Parallel Circuit Simulation," ECCTD'01—European Conference on Circuit Theory and Design, Aug. 28-31, 2001, Espoo, Finland, pp. II-113-II-116.

*Primary Examiner* — Akash Saxena
(74) *Attorney, Agent, or Firm* — Bever, Hoffman & Harms, LLPC

(57) ABSTRACT

In accordance with an exemplary simulation technique, an improved selective application of Newton-Raphson iterations can improve accuracy while ensuring good performance. In this method, selectively applying Newton-Raphson iteration in a simulation of a unit of the integrated circuit design can include determining second order effects to define a linearity value. Newton-Raphson iteration is performed when the linearity value is less than a linearity threshold and convergence of the simulation is not achieved.

17 Claims, 4 Drawing Sheets

(56) References Cited

U.S. PATENT DOCUMENTS

| | | | |
|---|---|---|---|
| 2006/0265203 A1* | 11/2006 | Jenny et al. | 703/9 |
| 2007/0079205 A1* | 4/2007 | Jeng et al. | 714/741 |
| 2007/0136044 A1* | 6/2007 | Beattie et al. | 703/14 |
| 2007/0299647 A1* | 12/2007 | Bolcato et al. | 703/14 |
| 2008/0010048 A1* | 1/2008 | Cheng et al. | 703/14 |
| 2009/0326882 A1* | 12/2009 | Fang | 703/2 |
| 2010/0235805 A1* | 9/2010 | Faivishevsky et al. | 716/19 |
| 2010/0332202 A1* | 12/2010 | Nakhla et al. | 703/2 |
| 2011/0029299 A1* | 2/2011 | Zhu et al. | 703/14 |
| 2012/0179443 A1* | 7/2012 | Van Batenburg et al. | 703/10 |
| 2013/0246015 A1* | 9/2013 | Dong et al. | 703/2 |

* cited by examiner

ELECTRONIC CIRCUIT SIMULATION METHOD WITH ADAPTIVE ITERATION

BACKGROUND OF THE INVENTION

1. Field of the Invention

The present invention relates to simulation of integrated circuits and in particular to selectively applying Newton-Raphson iterations to specific devices or circuit blocks based on their linearity values.

2. Related Art

As IC technology continues to shrink to 90 nm and below, total power consumption has become one of the most important concerns in chip designs. Known techniques such as power gating, voltage scaling, and variable threshold CMOS have been adopted to reduce standby leakage current and dynamic power dissipation. However, such techniques pose a significant challenge to both pre-layout and post-layout full chip verification due to the extremely large size of the matrices of the nodal analysis equation sets required for simulation.

For example, SPICE is a well-known general-purpose circuit simulation program developed by the University of California at Berkeley. SPICE can simulate circuits including, for example, resistors, capacitors, inductors, voltage sources, current sources, transmission lines, and common semiconductor devices. Fast-SPICE simulators use various algorithms to improve performance over traditional SPICE simulators. Notably, both SPICE and Fast-SPICE use LU (lower-upper) decompositions of matrices for nodal analysis, see e.g. U.S. Pat. No. 7,555,416, which issued on Jun. 30, 2009. Unfortunately, LU decompositions have significant limitations with respect to large-scale circuits.

FIG. 1 is an exemplary technique 100 for the transient analysis of an electronic circuit simulator, which consists of a Newton-Raphson loop 110 and a time-driven loop 120. Step 101 begins by determining model evaluation for a specific integrated circuit design, and initiating simulation based on the unit of the model at time t. Step 102 can solve for an equivalent resistive network numerically. In one embodiment, this network can be represented by linear equations according to a Modified Nodal Analysis (MNA) equation:

$$GV_n^{k+1} = I$$

where "G" is a Jacobian matrix that holds conductance values, "V" is a vector that holds voltage change values, "k" is an integer iteration designation starting at zero, "n" is a time stamp, and "I" is a vector that holds current values.

Step 103 determines whether k is greater than or equal to "1". If k=0 (i.e. before a traversal of loop 110), then step 106 increments k by one and returns to step 101. Generally, any iteration (i.e. a traversal of loop 110) after k=1 is termed a Newton-Raphson iteration. If k≥1, then step 104 determines whether convergence is achieved. If not, then step 106 once again increments k by one and returns to step 101. In this manner, successively better approximations are found to solve the MNA equations. Thus, Newton-Raphson iterations of loop 110 are repeated until convergence is reached in step 104. If convergence is achieved, then step 105 determines whether time t is greater than or equal to a specified total simulation period T (either by user or system default).

If time t is less than simulation period T, then step 107 of time-driven loop 120 can determine $h_{n+1}$, where h is the delta time period (i.e. the granularity that is governed by maximum local truncation error or voltage changes and $$t_{n+1} = t_n + h_{n+1}.$$

Using $h_{n+1}$, step 108 then predicts the next vector $V_{n+1}$ using extrapolation of previous steps and outputs simulation results of current step and, after additional units are simulated at time t, returns to step 101. Thus, time-driven loop 120 can perform transient analysis of the integrated circuit design over the specified time period T.

Note that the Jacobian matrix G is usually a sparse matrix and is determined by the circuit topology. If the circuit consists of only linear devices, e.g. resistors, then the fill-ins of the Jacobian matrix G are all constant numbers, and the vector V can be calculated through Gaussian elimination or LU decomposition method. However, most commercial application circuits include non-linear devices, e.g. diodes, MOSFETs, and/or bipolar junction transistors. In this case, the Jacobian matrix G becomes a function of the state vector V.

The dimension of the Jacobian matrix G is proportional to the size of the circuit. For state of art circuits that have millions of devices, the Jacobian matrix G is usually too big to be handled efficiently. In one embodiment, to more efficiently deal with such circuits, SPICE-like or Fast-SPICE algorithms can be used to partition the circuit into smaller blocks (generically called units above). This partitioning can be performed at the ideal source nodes and/or at weak coupling nodes, such as at the gates of transistors. Additionally, simplified models can be adopted to model the coupling effects at the boundary of different blocks. These types of simulation enhancements can be incorporated into technique 100. Thus, in one embodiment, technique 100 can be applied to each block of the integrated circuit design individually and asynchronously using loop 120. Such simulation enhancements can achieve 10-1000 times performance improvement with a reasonable sacrifice of accuracy.

Notably, for many blocks, loop 110 can converge (step 104) when k=1. In those cases, the first performance of step 102 solves the equation, while the second performance of step 102 effectively verifies the convergence. Thus, Newton-Raphson iteration does not significantly change the simulation result for many blocks. As a result, several known Fast-SPICE simulators turn off Newton-Raphson iteration by eliminating step 103, 104, and 106 such that step 105 directly follows step 102, to save the computation cost of additional iterations and accelerate the simulation speed.

This default elimination of the Newton-Raphson iteration from technique 100 usually works because most devices behave like linear devices from the simulator's point of view. However, as the scale of devices shrinks below 90 nm and the working voltage drops near the threshold voltage, the accuracy of technique 100 without Newton-Raphson iterations can deteriorate or even generate wrong simulation results. Therefore, a need arises for a simulation technique that selectively uses Newton-Raphson iterations.

SUMMARY OF THE INVENTION

As technology nodes continue to get smaller, simulators need to solve more complicated device models and correct for more severe non-linear effects. Existing simulation tools can include performing static partitioning and/or Newton-Raphson iterations for non-linear blocks to improve performance. Unfortunately, these techniques have been inadequate with regards to simulation accuracy for state of the art integrated circuit designs.

In accordance with an exemplary simulation technique, an improved selective application of Newton-Raphson iterations can improve accuracy while ensuring good performance. In this method, selectively applying Newton-Raphson iteration in a simulation of a unit of the integrated circuit design can include determining second order effects to define a linearity value. Newton-Raphson iteration is performed when the linearity value is greater than a linearity threshold.

In one embodiment of this improved simulation, model evaluation and time stamping are provided. An equivalent resistive network can be solved numerically for a unit of the design. The linearity value for the unit can be computed using a computer. The linearity value can be compared to the linearity threshold to determine whether Newton-Raphson iteration is needed. The method can determine whether convergence is achieved for simulation of the unit when Newton-Raphson iteration is needed. Further iteration is performed when such convergence is not achieved. The method proceeds to transient analysis of the unit when Newton-Raphson iteration is not needed, or when Newton-Raphson iteration is needed but convergence is achieved. A simulation results can be output based on the transient analysis.

Computing the linearity value for the unit can include computing a vector of an estimated voltage change for a next iteration loop as well as computing a vector of the voltage change of a current iteration loop. Computing either vector can include computing a Jacobian matrix and the change of the Jacobian matrix. In one embodiment, computing the Jacobian matrix and the change of the Jacobian matrix can include dropping off-diagonal values to reduce computation resources.

In one embodiment, a non-transitory, computer-readable medium storing computer-executable instructions for simulating an integrated circuit design is provided. These instructions, which when executed by a computer, perform the above-described steps.

DETAILED DESCRIPTION OF THE DRAWINGS

In accordance with an improved simulation technique, the non-linearity characteristics of a device or block in the integrated circuit design can be determined, and used to generate a linearity value. This linearity value can be compared to a linearity threshold to determine whether Newton-Raphson iteration is to be performed. Notably, by using the linearity value and threshold, it is not necessary to apply Newton-Raphson iteration to a whole block, even for a circuit block with strong non-linear effect devices. Indeed, in one embodiment, this improved simulation technique can selectively apply Newton-Raphson iteration (1) only to those devices that are determined to have linearity values that are larger than the linearity threshold and (2) only during one or more specified times of the transient simulation for such non-linear devices. Therefore, an improved simulation technique including selective Newton-Raphson iteration can provide an optimized balance of simulation accuracy and performance.

Figure 1:
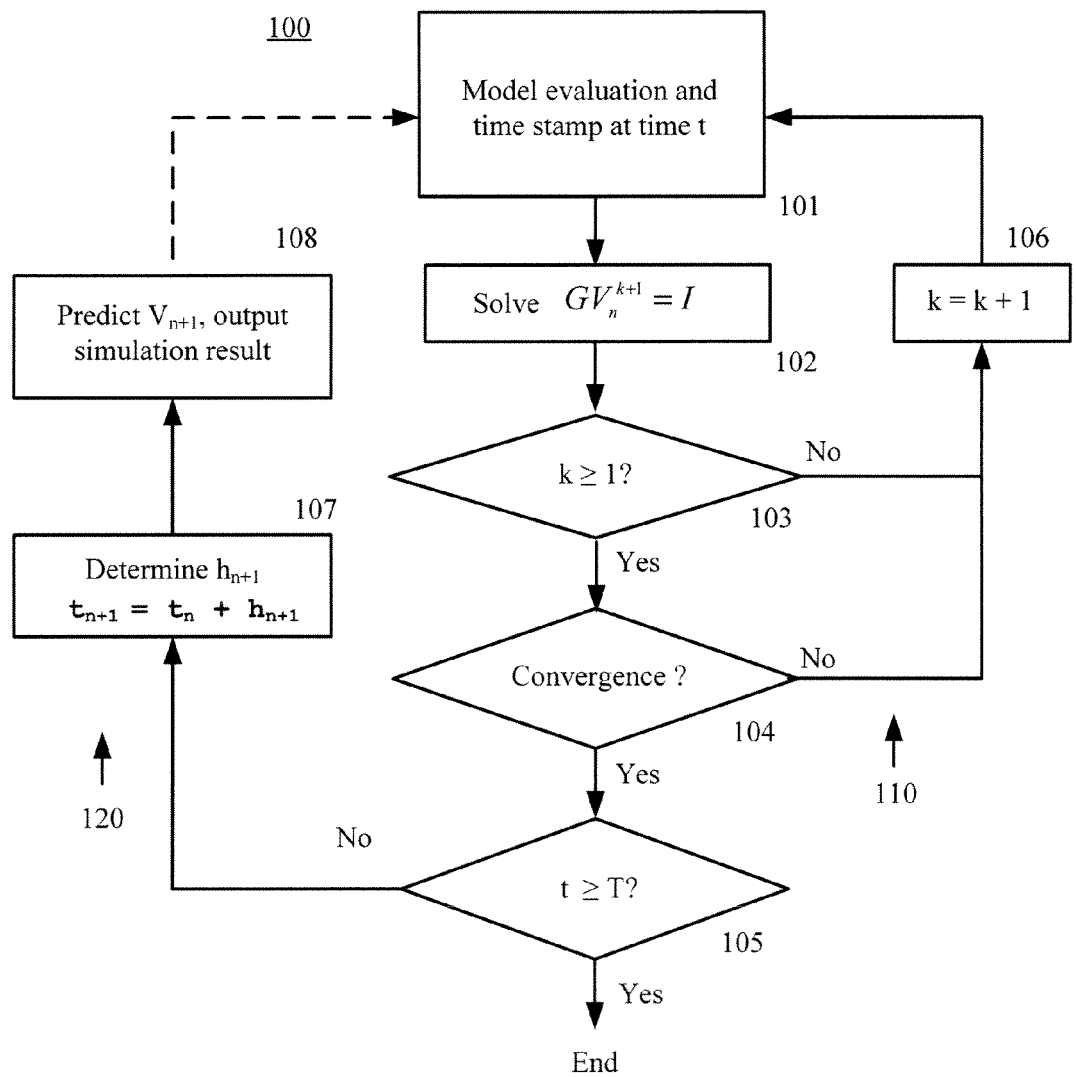
FIG. 1 illustrates a known simulation technique including Newton-Raphson iterations.
Figure 2:
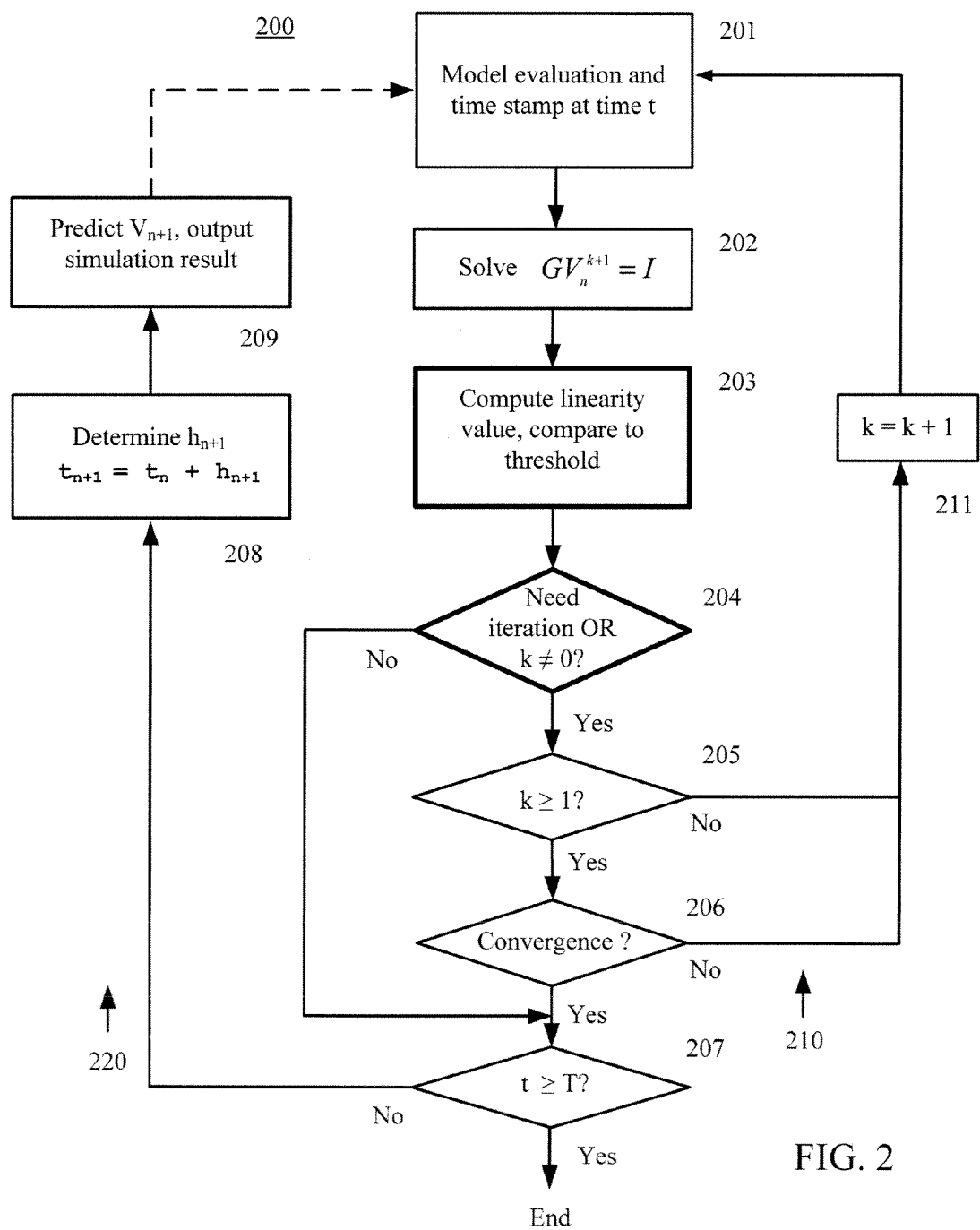
FIG. 2 illustrates an exemplary simulation technique including selective Newton-Raphson iterations.

FIG. 2 is an exemplary technique 200 for the transient analysis of an electronic circuit simulator, which consists of a Newton-Raphson loop 210 and a time-driven loop 220. Step 201 begins by determining model evaluation for a specific integrated circuit design, and initiating simulation of a unit at time t. Step 202 can solve for an equivalent resistive network numerically. As discussed above, this network can be represented by linear equations according to the Modified Nodal Analysis (MA) equation $GV_n^{k+1}=I$.

AT this point, the linearity value of a unit can be computed in step 203 by determining how fast a curve of a non-linear region is changing. This measurement can be characterized as an acceleration of the curve, which is effectively the second derivative of the measurement (i.e. second order effects). In one embodiment, this measurement is voltage.

A vector of an estimated voltage change for the next iteration loop is expressed by:

$$\Delta V' = \frac{\Delta G}{G} \cdot \Delta V$$

where $\Delta V$ is the vector of the voltage change of current iteration loop, $\Delta G$ is the estimated change of the Jacobian matrix for next iteration loop, and G is the Jacobian matrix of the current iteration loop.

The vector of the voltage change of current iteration loop is computed by solving the MNA equation in the step 202, and can be expressed as:

$$\Delta V = \begin{pmatrix} \Delta v_1 \\ \vdots \\ \Delta v_n \end{pmatrix}$$

where $v_i$ the voltage of each node in the unit.

The Jacobian matrix of the current iteration loop and the inversion of the Jacobian matrix are computed in the step 202 and can be re-used here:

$$G = \begin{bmatrix} g_{11} & \cdots & g_{1n} \\ \vdots & \ddots & \vdots \\ g_{n1} & \cdots & g_{nn} \end{bmatrix}$$

The estimated change of the Jacobian matrix for next iteration loop can be computed by:

$$\Delta G = \begin{bmatrix} g_{11} & \cdots & g_{1n} \\ \vdots & \ddots & \vdots \\ g_{n1} & \cdots & g_{nn} \end{bmatrix}$$

where $$\Delta g_{ij} = \left( \frac{\partial g_{ij}}{\partial v_1} \cdots \frac{\partial g_{ij}}{\partial v_n} \right) \cdot \begin{pmatrix} \Delta v_1 \\ \vdots \\ \Delta v_n \end{pmatrix}$$

Note that the calculation of $\Delta G$ may be computation intensive, thereby incurring some overhead. A more aggressive method is to drop the off-diagonal values in both G and $\Delta G$, thereby simplifying the above equations to:

$$\Delta v'_i = \frac{\Delta g_{ii}}{g_{ii}} \cdot \Delta v_i$$

Step 204 can identify the maximum value $\Delta v'\text{max}_i$ (absolute value) in the vector $\Delta v'_i$. If $\Delta v'\text{max}_i$ is larger than the convergence threshold, then this unit needs iteration. Otherwise, iteration is not needed. Notably, step 204 also determines whether $k \neq 0$. Thus, when iteration is not needed and k is equal to 0, then technique 200 proceeds directly to step 207. However, when iteration is needed or $k \neq 0$, then step 204 proceeds to step 205.

When k=0 (i.e. k is not ≥1) at step 205, then k is incremented by "1" in step 211, and the technique returns to step 201. When k≥1, step 206 then determines whether convergence is achieved. If not, then step 211 once again increments k by one and returns to step 201. In this manner, successively better approximations are found to solve the MNA equations. Thus, loop 210 can be repeated until convergence is reached in step 206. In one embodiment, not shown in FIG. 2, loop 210 can be repeated until a predetermined number of iterations have been performed, e.g. k=Z, where Z is a maximum number of allowed iterations. In one embodiment, when k=Z, a simulation warning can be sent to the user indicating that convergence for that unit is not possible and therefore simulation will proceed to the next unit. If convergence is achieved, then step 207 can determine whether time t is greater than or equal to a specified total simulation period T (set either by user or system default).

If time t is less than simulation period T, then step 208 of time-driven loop 220 can determine $h_{n+1}$ and $t_{n+1}=t_n+h_{n+1}$. Step 209 can predict vector $V_{n+1}$ and output simulation results at time t and, after additional units are simulated at time t, can return to step 201. Thus, time-driven loop 220 can perform transient analysis of the unit over the specified time period T.

In one embodiment, the unit for model evaluation can be at the block level. To form these blocks, circuits of the integrated circuit design may be partitioned/cut at ideal voltage source nodes and weak coupling nodes (such as the gates of MOSFETs or regulated power nodes, etc).

Notably, the use of the linearity threshold in technique 200 can add significant flexibility to the simulation process. Specifically, decreasing the linearity threshold results in a more aggressive definition of linearity, thereby increasing the number of units subject to Newton-Raphson iteration and improving simulation accuracy. On the other hand, increasing the linearity threshold results in a less aggressive definition of linearity, thereby decreasing the number of units subject to Newton-Raphson iteration and improving performance time at the expense of simulation accuracy. In one embodiment, the linearity threshold can be programmable (e.g. user programmable).

Technique 200 can also be incorporated into a hierarchically-partitioned circuit simulator. In a hierarchical solver, a sub-circuit block can be further partitioned into lower-level smaller blocks, which in turn can be further partitioned. In general, there can be any number of hierarchies designated in the integrated circuit design. For hierarchically-partitioned blocks, at each time interval during the transient analysis, the lowest level blocks can be evaluated first and the equivalent Schur complement matrixes can be stamped into the Jacobian matrix of the upper level block. This process can continue recursively until reaching the top level of the integrated circuit design. This process can be followed by a top-down recursive process to update the voltages of the internal node voltages using the updated voltages of the ports. Thus, Newton-Raphson iteration can be performed either at the evaluation of the blocks at each individual lower level of the partition, or at the top level of the integrated circuit design. Note that integrating technique 200 to individual lower level of blocks can provide the advantage of reducing the number of Newton-Raphson iterations.

In other embodiments, the unit for model evaluation may vary based on user-designated areas of the integrated circuit design. For example, for areas of the design that are typically highly non-linear, the user may specify a higher granularity for model evaluation than other areas of the design. In yet other embodiments, the unit for model evaluation can be of any specific granularity, e.g. inverter, buffer, adder, ALU (arithmetic logic unit), or any user-specified unit cell size.

In yet other embodiments, the unit for model evaluation can be at the device level, e.g. transistor, capacitor, etc. This granularity can be useful because some devices have both linear and non-linear regions depending on operation, applied voltages, and other factors. In one embodiment, the above-described Newton-Raphson iterations can be applied to the non-linear regions, but not the linear regions, thereby simultaneously improving simulation accuracy and performance.

Figure 4:
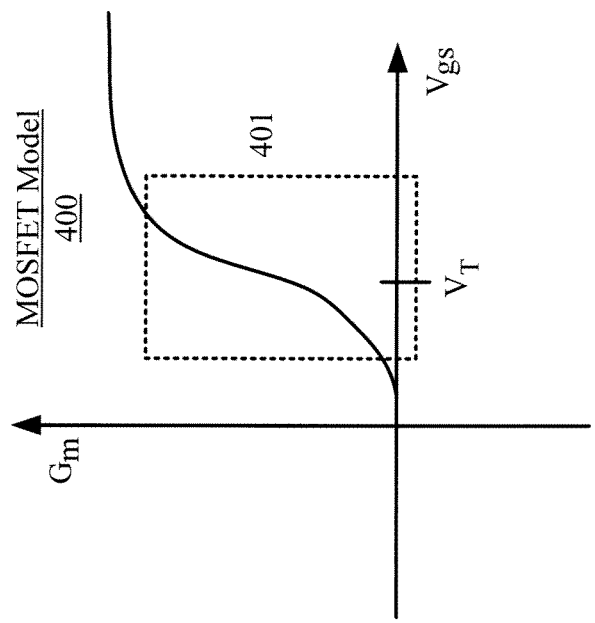
FIGS. 3 and 4 illustrate exemplary device models having both linear and non-linear regions.
Figure 3:
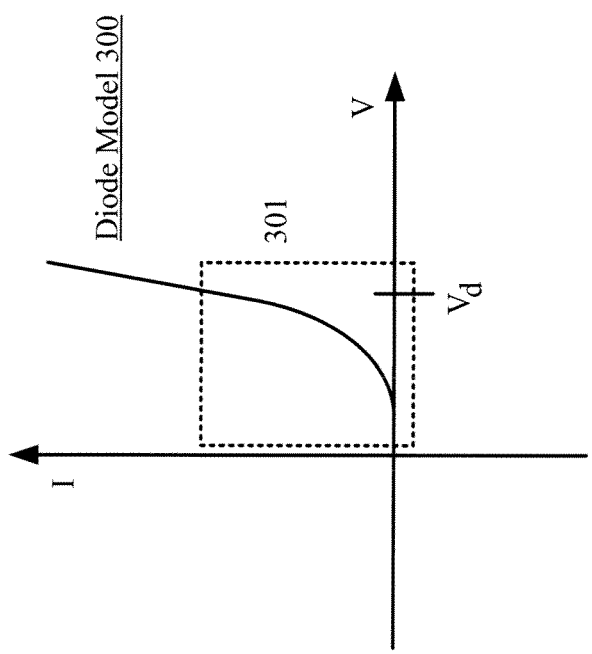

FIGS. 3 and 4 illustrate exemplary device models having both linear and non-linear regions. Specifically, FIG. 3 illustrates a diode model 300 having a non-linear region 301. FIG. 4 illustrates a MOSFET model 400 having a non-linear region 401.

The estimated change of the Jacobian matrix for the next iteration loop $\Delta G$ for diode model 300 (or other two-terminal non-linear devices) can be computed by:

$$\Delta G = \begin{bmatrix} \frac{d^2 i}{dv^2}(\Delta v_a - v_b) & -\frac{d^2 i}{dv^2}(\Delta v_a - \Delta v_b) \\ -\frac{d^2 i}{dv^2}(\Delta v_a - v_b) & \frac{d^2 i}{dv^2}(\Delta v_a - \Delta v_b) \end{bmatrix}$$

where $$\frac{d^2 i}{dv^2}$$

is the second order derivative of a diode I-V curve (see, e.g. FIG. 3) at the crossing voltage $v=v_a-v_b$, wherein "a" refers to an anode of a diode and "b" refers to the cathode of the diode.

The estimated change of the Jacobian matrix for the next iteration loop $\Delta G_m$ for MOSFET model 400 can be computed by:

$$\Delta G_m = \begin{bmatrix} \frac{dg_m}{dv}(\Delta v_g - v_s) & -\frac{dg_m}{dv}(\Delta v_g - \Delta v_s) \\ -\frac{dg_m}{dv}(\Delta v_g - v_s) & \frac{dg_m}{dv}(\Delta v_g - \Delta v_s) \end{bmatrix}$$

wherein "g" refers to the gate of a MOSFET and "s" refers to the source of the MOSFET. Note that the specific equations for any device (including any device not described in detail herein) generally follow those above and can be easily derived therefrom.

Figure 5:
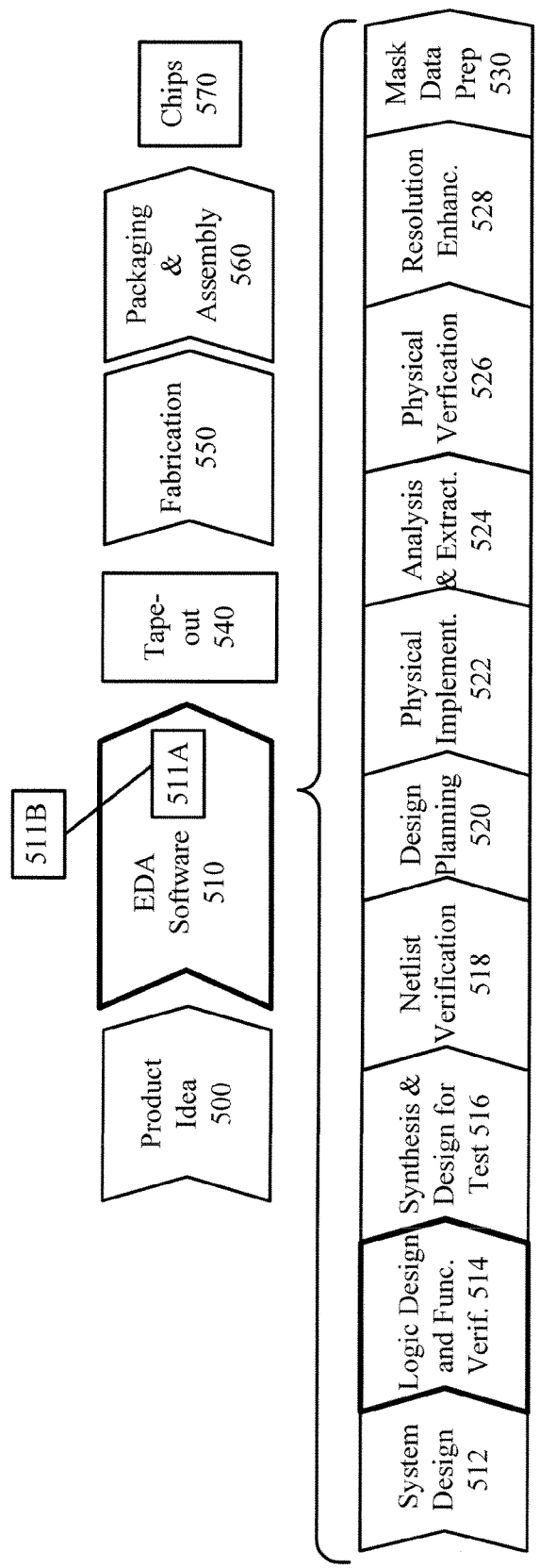
FIG. 5 shows a simplified representation of an exemplary digital ASIC design flow including selective Newton-Raphson iterations.

Thus, a simulation technique including selective Newton-Raphson iterations can advantageously be applied to any partition method, any unit granularity (e.g. device, circuit, block etc) and any characterized unit (i.e. both linear and non-linear). Performance of Fast-SPICE simulation with selective Newton-Raphson iterations can be improved up to 2× compared to standard Fast-SPICE simulation without selective Newton-Raphson iterations FIG. 5 shows a simplified representation of an exemplary digital ASIC design flow. At a high level, the process starts with the product idea (step 500) and is realized in an EDA software design process (step 510). When the design is finalized, it can be taped-out (event 540). After tape out, the fabrication process (step 550) and packaging and assembly processes (step 560) occur resulting, ultimately, in finished chips (result 570).

The EDA software design process (step 510) is actually composed of a number of steps 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 510) will now be provided. In one embodiment, one or more steps of the EDA software design process can be implemented using a computer-readable medium 511A, which is read by a computer 511B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 512): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 514): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS®, VERA®, DesignWare®, Magellan™, Formality®, ESP™, LEDA®, HSIM®, NanoSim®, and CustomSim™ products. The above-described simulation technique 200 including selective Newton-Raphson iterations can be seamlessly incorporated into the simulation tools and used during this verification step.

Synthesis and design for test (step 516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 518): At this step, the netlist is checked for compliance with timing constraints and for correspondence with the VHDL/Verilog source code. Exemplary EDA software products from Synopsys, Inc. that can be used at this step include Formality®, PrimeTime™, and VCS®.

Design planning (step 520): Here, an overall floorplan for the chip is constructed and analyzed for timing and top-level routing. Exemplary EDA software products from Synopsys, Inc. that can be used at this step include Astro™ and IC Compiler™ products.

Physical implementation (step 522): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 524): At this step, the circuit function is verified at a transistor level, this in turn permits what-if refinement. Exemplary EDA software products from Synopsys, Inc. that can be used at this step include AstroRail™, PrimeRail™, Primetime®, and Star RC/XT™ products.

Physical verification (step 526): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 528): This step involves geometric manipulations of the layout to improve manufacturability of the design. Exemplary EDA software products from Synopsys, Inc. that can be used at this step include Proteus™, Proteus™, and PSMGen™ products.

Mask data preparation (step 530): This step provides the "tape-out" data for production of masks for lithographic use to produce finished chips. Exemplary EDA software products from Synopsys, Inc. that can be used at this step include the CATS® family of products.

The above-described simulation technique including selective Newton-Raphson interations can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method of simulating an integrated circuit design, the method comprising:
   using a computer, selectively applying a Newton-Raphson iteration in a simulation of a unit of the integrated circuit design,
   wherein the step of selectively applying includes determining second order effects to define a linearity value, and
   wherein the Newton-Raphson iteration is performed when the linearity value is greater than a linearity threshold and convergence of the simulation is not achieved.

2. A method of simulating an integrated circuit design, the method comprising:
   providing model evaluation and time stamping;
   solving for an equivalent resistive network numerically for a unit of the design;
   using a computer, computing a linearity value for the unit;
   comparing the linearity value to a linearity threshold to determine whether a Newton-Raphson iteration is needed;
   determining whether convergence is achieved for simulation of the unit when the Newton-Raphson iteration is needed;
   performing Newton-Raphson iteration when the convergence is not achieved;
   proceeding to transient analysis of the unit when the Newton-Raphson iteration is not needed or when Newton-Raphson iteration is needed but the convergence is achieved; and
   outputting simulation results based on the transient analysis.

3. The method of claim 2, wherein the computing a linearity value for the unit includes:
   computing a vector of an estimated voltage change for a next iteration loop.

4. The method of claim 3, wherein the computing the vector of the estimated voltage change for the next iteration loop includes computing a Jacobian matrix.

5. The method of claim 4, wherein the computing the Jacobian matrix includes dropping off-diagonal values in the Jacobian matrix.

6. The method of claim 3, wherein the computing the linearity value further includes:
   computing a vector of the voltage change of a current iteration loop.

7. The method of claim 6, wherein the computing the vector of the voltage change of a current iteration loop includes computing a Jacobian matrix.

8. The method of claim 7, wherein the computing the Jacobian matrix includes dropping off-diagonal values in the Jacobian matrix.

9. The method of claim 2, wherein the solving for the equivalent resistive network includes repeating the solving before performing a first Newton-Raphson iteration.

10. A non-transitory, computer-readable medium storing computer-executable instructions for simulating an integrated circuit design, which when executed by a computer perform steps comprising:
    providing model evaluation and time stamping;
    solving for an equivalent resistive network numerically for a unit of the design;
    using a computer, computing a linearity value for the unit;
    comparing the linearity value to a linearity threshold to determine whether a Newton-Raphson iteration is needed;
    determining whether convergence is achieved for simulation of the unit when the Newton-Raphson iteration is needed;
    performing Newton-Raphson iteration when the convergence is not achieved;
    proceeding to transient analysis of the unit when the Newton-Raphson iteration is not needed or when Newton-Raphson iteration is needed but the convergence is achieved; and
    outputting simulation results based on the transient analysis.

11. The non-transitory, computer-readable medium of claim 10, wherein the computing a linearity value for the unit includes:
    computing a vector of an estimated voltage change for a next iteration loop.

12. The non-transitory, computer-readable medium of claim 11, wherein the computing the vector of the estimated voltage change for the next iteration loop includes computing a Jacobian matrix.

13. The non-transitory, computer-readable medium of claim 12, wherein the computing the Jacobian matrix includes dropping off-diagonal values in the Jacobian matrix.

14. The non-transitory, computer-readable medium of claim 11, wherein the computing the linearity value further includes:
    computing a vector of the voltage change of a current iteration loop.

15. The non-transitory, computer-readable medium of claim 14, wherein the computing the vector of the voltage change of a current iteration loop includes computing a Jacobian matrix.

16. The non-transitory, computer-readable medium of claim 15, wherein the computing the Jacobian matrix includes dropping off-diagonal values in the Jacobian matrix.

17. A tool for simulating an integrated circuit design, the tool comprising:
    means for providing model evaluation and time stamping;
    means for solving for an equivalent resistive network numerically for a unit of the design;
    means for computing a linearity value for the unit;
    means for comparing the linearity value to a linearity threshold to determine whether a Newton-Raphson iteration is needed;
    means for determining whether convergence is achieved for simulation of the unit when the Newton-Raphson iteration is needed;
    means for performing Newton-Raphson iteration when the convergence is not achieved;
    means for proceeding to transient analysis of the unit when the Newton-Raphson iteration is not needed or when Newton-Raphson iteration is needed but the convergence is achieved; and
    means for outputting simulation results based on the transient analysis.

* * * * *